(12) United States Patent
Tripathi

(10) Patent No.: US 7,683,403 B2
(45) Date of Patent: Mar. 23, 2010

(54) SPATIALLY AWARE DRIVE STRENGTH DEPENDENT DIE SIZE INDEPENDENT COMBINATORIAL SPARE CELL INSERTION MANNER AND RELATED SYSTEM AND METHOD

(75) Inventor: Anshuman Tripathi, Longmont, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 12/057,758

(22) Filed: Mar. 28, 2008

(65) Prior Publication Data

US 2008/0237644 A1 Oct. 2, 2008

Related U.S. Application Data

(60) Provisional application No. 60/921,023, filed on Mar. 30, 2007.

(51) Int. Cl.
*H01L 29/76* (2006.01)
*G06F 17/50* (2006.01)

(52) U.S. Cl. ............... 257/202; 257/203; 257/E29.226; 716/6; 716/8

(58) Field of Classification Search ......... 257/202–203, 257/206, 208, 265, E29.226; 438/14; 716/6–10, 716/13, 21
See application file for complete search history.

(56) References Cited

U.S. PATENT DOCUMENTS

| 6,453,454 | B1 * | 9/2002 | Lee et al. | ....................... 716/11 |
| 2005/0251776 | A1 * | 11/2005 | Hsin et al. | ..................... 716/11 |

* cited by examiner

*Primary Examiner*—Victor A Mandala
*Assistant Examiner*—Whitney Moore
(74) *Attorney, Agent, or Firm*—Lisa K. Jorgenson; William J. Kubida

(57) ABSTRACT

A design method for an integrated circuit adds spare cells in a System-on-Chip to allow for Engineering Change Orders (ECOs) to be performed at a later stage in the design. This method can be used to provide a second version of the chip having minimal alterations performed in a short cycle time. The spare cells can be divided into combinational and sequential cells. There is an optimum spread of combinational cells in the design for post placement repairs of the chip with just metal layer changes. The method takes into account the drive strength of the spare cells as the main factor in their placement on the chip.

17 Claims, 2 Drawing Sheets

(a)

(b)

(c)

(d)

SPATIALLY AWARE DRIVE STRENGTH DEPENDENT DIE SIZE INDEPENDENT COMBINATORIAL SPARE CELL INSERTION MANNER AND RELATED SYSTEM AND METHOD

The present application claims the benefit of U.S. Provisional Patent Application No. 60/921,023 filed on Mar. 30, 2007, which is hereby incorporated by reference in its entirety for all purposes as if fully set forth herein.

FIELD OF THE INVENTION

The present invention relates to integrated circuit and more particularly to the use of the filler cell area in a System-on-Chip integrated circuit.

BACKGROUND OF THE INVENTION

There are generally three types of ICs that a circuit designer may use to implement a custom design.

A field-programmable gate array (FPGA) is an integrated circuit having a number of circuit blocks that can be interconnected in any desired manner by programming interconnection switches disposed on the FPGA die. Therefore, a circuit designer may program the FPGA with firmware to implement any circuit that the FPGA is capable of implementing.

A full-custom application-specific integrated circuit (ASIC) is laid out on the transistor level to implement the designer's circuit. Typically, the designer presents a circuit topology, in the form of a netlist, to a semiconductor manufacturer. The manufacturer lays out the circuit (typically with placing and routing software) transistor by transistor.

A semi-custom ASIC is laid out on a circuit-cell level to implement the designer's circuit. Typically, the designer presents a circuit topology, in the form of a netlist, to the semiconductor manufacturer. The manufacturer lays out the circuit (typically with placing and routing software) cell by cell. Each cell contains a pre-established set of circuit components that may be interconnected as desired. For example, each cell may contain a flip-flop or another logic gate (for example, NAND gate, OR gate, inverter gate, etc.). The placing and routing software "builds" the circuit defined by the netlist using these cells, and then generates the appropriate node connections between the cells. The software may also define circuit macros, which are groups of cells interconnected in a pre-established manner. For example, the software may define a phase-locked loop (PLL) using the cells, so that the designer may designate a pre-established PLL in his netlist, instead of having to manually define the PLL on a cell-by-cell or a transistor-by-transistor basis.

FIG. 1 is a top view of a 9-cell portion 10 of a semi-custom ASIC. As an example, a semi-custom ASIC may include 100,000 or more cells 12 that are arranged in a checkerboard pattern. Typically, the higher the number of cells, the larger the IC die needed to implement the circuit.

FIG. 2 is a perspective view of a single cell 12 of FIG. 1.

The cell 12 includes a top conductive layer 14, which may be used, for example, as a portion of a power-supply plane VDD. That is, because the cells are contiguous in the ASIC, the top layer 14 of each cell merges with the top layers 14 of the contiguous cells to form a continuous conductive plane that spans the entire die.

Beneath the top layer 14 is an insulator layer 16 and another conductive layer 18, which may be used, for example, as a portion of a ground plane.

A region 20 includes one or more polysilicon and/or metal interconnection layers that form, for example, interconnections between the components within the cell 12 and also connections from the cell to neighboring cells. This region may also include layers that form, for example, polysilicon structures such as transistor gates.

A substrate 22 may be made from silicon, another semiconductor material, or another appropriate material, and may include, for example, the drain and source regions of CMOS transistors, the base, emitter, and collector regions of bipolar transistors, and isolation structures such as isolation trenches or field-oxide regions.

The cell 12 may include other layers and regions that are not shown in FIG. 2.

Still referring to FIG. 2, the region 20 and the substrate 18 of the cell 12 contain a predetermined arrangement of components therein. For example, the cell 12 may include transistors that are connected together to form, for example, a flip-flop, one or more combinatorial logic gates (for example, a NAND gate, a NOR gate, an inverter), or some combination of the same. The interconnections between these intracellular components as specified by the designer may be implemented in the one or more metal layers within the region 20. Alternatively, the interconnections between these intracellular components may be fixed, and the designer may later on specify the interconnections between cells.

So the design process for a semi-custom IC is typically as follows.

The designer provides a circuit netlist in some hardware description language, for example, Verilog, which defines the functionality of the circuit.

Next, the manufacturer takes this netlist and using known techniques (for example, Synthesis) determines how many cells will be needed to implement the circuit, and thus the minimum dimensions of the die that are needed to implement the circuit.

The manufacturer includes in this estimate of the number of cells, a number of additional cells, often called "spare" cells. These spare cells are available at a later stage of manufacturing or after the manufacturing of the die to correct problems that are found during various testing stages of the die. For example, it may be discovered that a signal that needs to be inverted at a certain point is not inverted. Therefore, the manufacturer may use an inverter in a spare cell to invert this signal. If the mistake is in the layout itself, then the manufacturer may merely change the mask of an appropriate one of the metal layers in the region 20 to make this connection to the spare inverter, such that all subsequently manufactured versions of the circuit work properly. Alternatively, if the problem is limited to one or a small number of ASICs, then the manufacture may use ion-beam or other similar technologies to manually route the signal through the spare inverter. Using spare cells in this manner may significantly increase the yield of the semi-custom ASIC, and thus significantly reduce the cost per ASIC.

As an example, assume that a circuit design requires 100,000 cells for implementation. Using known techniques, the manufacturer may determine that for such a circuit, statistically speaking, 10% or 10,000 additional spare cells are needed to make sure that there are enough spare cells to correct any defects that may occur post layout and manufacture of the chip.

After the number of needed cells is determined (the sum of the cells needed for the circuit implementation plus the statistically determined number of spare cells, for a total of 110,000 in this example), the manufacturer generates a modified netlist that adds the spare cells to the circuit cells. For example, the manufacturer may add spare macro circuits to the netlist, each macro circuit including a variety of spare cells. For example, assume that there are sequential and combinatorial logic gate cells. The manufacturer wants spares of all these different types of cells located throughout the chip. So the manufacturer may generate these macros including at least one of each of these types of cells. For example, the manufacturer may create a macro that is a ring oscillator including all these types of components, with the intent that the ring oscillator not be used as a ring oscillator but for its components if spares are needed.

Typically, even a very efficient utilization of IC area means that an implemented circuit, including the spare cells, does not utilize 100% of the chip area. Therefore, even in designs that use the IC area efficiently, around 40% of the area can still be unused.

Now if this unused area were left empty, that is, void of cells, then there would be "holes" in the IC as one looks down from above where no functional or spare cells are needed.

To plug these holes, filler cells are used.

Referring to FIG. 2, a filler cell is similar to the cell 12 except that it typically includes no interconnections for netlist functionality within the region 20. That is, the region 20 may just include continuous layers, or a continuous single layer such as an insulator layer or some rudimentary maintenance constructs. However, the conductive layers 14 and 18 are present so as to provide a continuous conductive plane (for example, VDD and ground planes) with no "holes" in it, and of course the substrate 22 is included so that the substrate is continuous as well.

Therefore, the resulting semi-custom ASIC typically has three types of cells. Functional cells which form circuits that are part of the overall circuit design originally submitted by the designer, spare cells whose function is to provide spare components if they are needed to modify the functionality of the chip after placement & routing at various stages of manufacture, and the filler cells.

One problem with this approach is that the number of cells in a semi-custom ASIC die, and thus the area of the die itself, is typically significantly increased by including the spare cells. For example, in the example given above, the size of the die is effectively increased 10% (from 100,000 cells to 110,000 cells) to accommodate the 10,000 spare cells.

Another problem is that the locations of these pre-connected spare cells may be tied to the locations of other connected spare cells, and thus these spare cells may not be uniformly available over the die.

Another problem is that even when they are not used, these spare cells typically draw quiescent current and thus add to the power consumed by the chip. So the number of spare cells that can be used is limited by the power budget of the chip. And because the locations of these limited number of spare cells may tend to be clustered due to a redundant pattern (for example, the ring oscillator described above), then this may result in areas of the chip lacking a sufficient number of spare cells to fix a defect that may be later discovered.

What is desired, therefore, is a method of effectively utilizing the space that would eventually be filled with filler cells in an integrated circuit in a manner that overcomes the problems associated with the prior art approaches mentioned above, thereby providing an optimum spare cell distribution.

SUMMARY OF THE INVENTION

According to an embodiment of the present invention, spare cells are added in a System-on-Chip to allow for Engineering Change Orders (ECOs) to be performed at a later stage in the design. The method of the present invention can be used to provide a second version of the chip having minimal alterations performed in a short cycle time. The spare cells can be divided into combinational and sequential cells. According to the present invention, there is an optimum spread of combinational cells in the design for post placement repairs of the chip with just metal layer changes. Primarily, the method of the present invention takes into account the drive strength of the spare cells as the main factor in their placement on the chip.

In the prior art, the addition of any cell increases the cell count of the design and thus increases the area of the chip. Thus, the addition of spare cells increases the area of the design. However, during cell placement there are normally blank spaces left out due to various reasons leading to the utilization metric. The higher the congestion, the higher the utilization value. The utilization rate is never 100%. According to the design method of the present invention, combinational spare cells are inserted into the filler cells (blank spaces) based upon a drive strength algorithm. Thus, post-modification, the chip has unconnected combinational cells strewn throughout the chip in a specific, identifiable, pattern. The presence of such a pattern in an "all filler" or zero percent utilization region can be used to detect the usage of the present design method in any chip, or a portion thereof.

DETAILED DESCRIPTION

Figure 2:
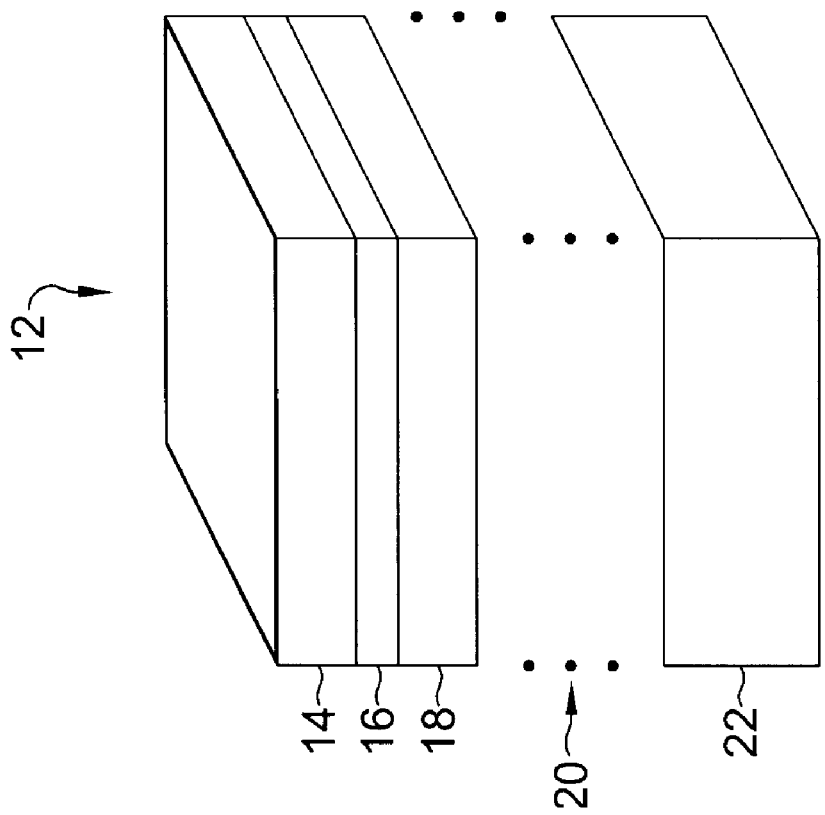
FIG. 2 is a perspective view of a single cell 12 of FIG. 1 according to the prior art.
Figure 1:
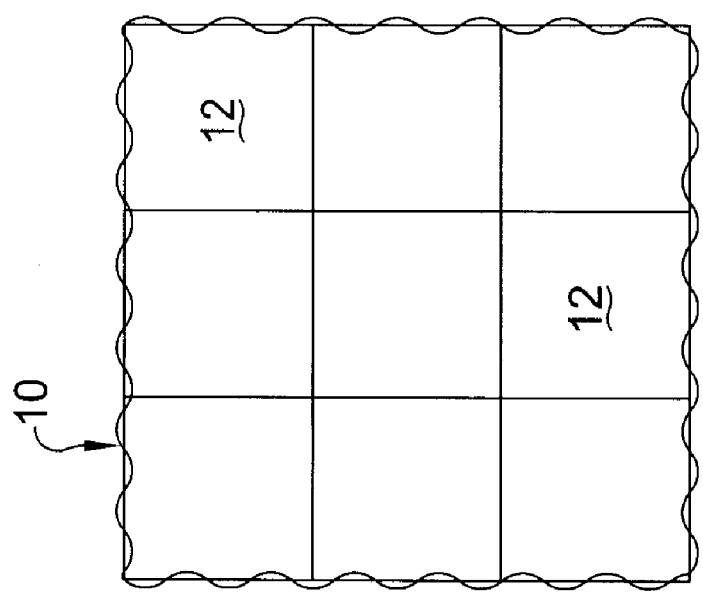
FIG. 1 is a top view of a 9-cell portion 10 of a semi-custom ASIC according to the prior art.

Although the following description uses the design of a semi-custom ASIC as an example, the description may also apply to full-custom ASICs, FPGAs, other programmable logic devices (PLD), and other ICs in general.

Generally, an embodiment of the invention is to strategically swap filler cells for spare cells in an IC such as a semi-custom IC. This embodiment may provide some advantages. First, strategically placing the spare cells provides more insurance that spares will be located in areas of the chip where they may be needed. Second, strategically placing the non-sequential spares, such as the combinatorial spare cells, means that these spares no longer need be tied to the locations of other spares for example, spare flip-flops. Nevertheless, the spares may still be connected in a specific pattern. Third, additional spare cells need not be added to the design, or at least not as many. That is, the spare cells need not increase the size of the chip, or at least not as much, because at least some of the spare cells are merely taking the place of filler cells that would be present in the IC anyway. This may reduce the overall dimensions of the chip, or may add some flexibility if the customer or the designer later wants to add more spares to the chip without increasing the size of the chip.

So in one embodiment, the design process is as follows.

The designer submits his circuit netlist.

The manufacturer then determines how many spare cells are needed based on the design, but taking into account that at least some of these spare cells can be merely inserted later in place of a filler space. At one extreme, the designer may account for no spare cells, and just plan on swapping out filler cells for spare cells after placement so that the inclusion of spare cells need not increase the size of the chip. As an alternative, the manufacturer may allocate fewer spare cells. So for 100,000 cell design, instead of allocating an extra 10,000 cells for spares, the manufacturer may allocate only an extra 5,000 cells for spares, with the idea that he will also swap out 5,000 filler cells for spare cells so that he'll get a total of 10,000 spare cells but with only a 5,000 cell increase impacting the chip size.

After the manufacturer determines the number of spares that he wants to add in, he places and routes the design as discussed herein, including the spare macros that may cause the spare cells to be placed close to other spare cells.

After the chip is placed, that is, the cells are placed on the chip and a routing scheme between them is determined, the manufacturer uses the placing and routing software to manually replace some of the filler cells with spare cells.

One technique for strategically swapping the filler cells for spare cells is to space out each spare so that the distance to the closest surrounding spares is within a function of the drive strength of the particular spare. The Manhattan distance between the spares takes into account, for example, line capacitance and delay, timing tolerances of the chip, and other similar design rules and constraints. The same distance can also be defined with the Euclidean distance or through a Steiner tree.

Generally multiple cells with the same functionality but different drive strengths are available to aid meeting design constraints. Example drive strengths include ×1, ×2, ×4, ×8, ×16, and ×24.

The manufacturer, taking into account the drive strengths, manually or with a software calculates the position space for spares and thus places the spares where the placing and routing software has put filler cells to provide spare coverage to all parts of the chip while reducing, or even optimizing, the number of spares needed. Spare coverage to all parts of the chip insures that if a signal needs to be routed from one end of the chip to another end of the chip, there are spare cells available to provide the same. That is, this prevents a situation from occurring where the only way to route a signal from one location to another is through spares that are spaced apart farther than the Manhattan distance they can drive, thereby violating signal-timing and other design constraints.

An embodiment of this concept according to the present invention is shown in the diagrams of FIGS. 3(a) through 3(d), as explained in further detail below.

Figure 3:
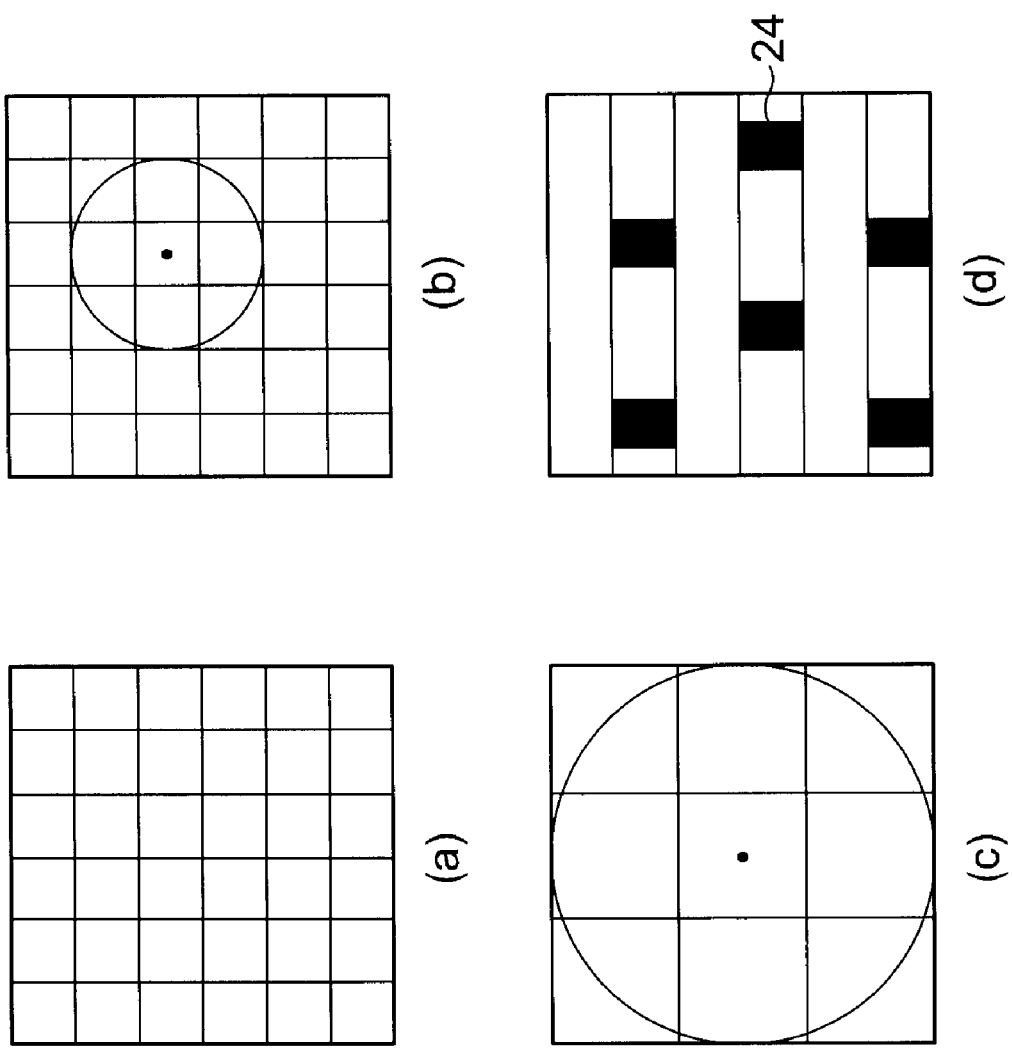
FIG. 3(a) is a grid pattern of a portion of a System-on-Chip according to the present invention.
FIG. 3(b) is a grid pattern of a portion of a System-on-Chip according to the present invention showing a dot representing the cell location within a grid cell space from where a signal is driven outside of the grid cell, and the circle has a radius equal to the Manhattan distance, a function of the drive strength.
FIG. 3(c) is a parser grid pattern of the same portion of a System-on-Chip as in FIG. 3(b) according to the present invention showing that if a cell has a higher drive strength, then the Manhattan distance, and thus the circle, gets bigger.
FIG. 3(d) is a grid pattern of a portion of a System-on-Chip according to the present invention showing placed spare cells having the same drive strengths, and roughly equal Manhattan distances, determined by their drive strengths.

FIG. 3(a) is a grid pattern of a portion of a System-on-Chip according to the present invention.

In the diagram of FIG. 3(b), the dot represents the location within a grid space from where a signal is driven outside of the cell, and the circle has a radius equal to the Manhattan distance. Therefore, the closest spare cells to this particular spare cell are placed within the circle to ensure that the middle spare cell can drive a signal to an adjacent spare cell without violating any design constraints.

FIG. 3(c) shows that if a cell has a higher drive strength, then the Manhattan distance, and thus the circle, gets bigger.

FIG. 3(d) is a view of placed spare cells 24 having the same drive strengths, placed such that any signal can be passed from one boundary to the other by using the spare cells alone. If one draws around anyone of these spare cells 24 a circle having a radius equal to the Manhattan distance, the closest surrounding ones of the other spare cells would be within the circle such that a signal can propagate from one spare cell to any other spare cell without violating timing constraints.

A manufacturer may make a trade off between the number of spares that he swaps (manually or with some software) in for filler cells versus the drive strengths of the spares. That is, the manufacturer may use fewer spares that have higher drive strengths, or more spares that have lower drive strengths or a combination of both, depending on various budgets and constraints of the IC, for example, available filler space, and power budgets, and past experiences.

Although described in conjunction with a semi-custom ASIC, this or a similar may be used in full-custom ASICs or other types of ICs.

So as stated above, an advantage of an embodiment of the above-described technique is a reduction in the number of dedicated spare cells that are added into the design that impact the size of the chip.

It may also allow flexibility if somebody wants to add more spares later. That is, the placing and routing need not be redone, that is, the netlist doesn't need to be modified to include additional spare cells, which would change the placing and routing and would require going through the whole placing and routing process again. Instead, the manufacturer may manually place these extra spares by swapping them in place of filler cells.

An IC formed by an embodiment of the above-described technique may be, for example, a memory, an analog IC, a mixed analog-digital IC, or a digital IC.

Such an IC may be incorporated into a system, such as a computer system, and may be coupled to one or more other ICs, such as a controller, that is also part of the system, or perhaps just a hard macro or pre-placed block of an IC.

An integrated circuit has been described including spare cells disposed within a region of filler cells, a distance between each spare cell and an adjacent spare cell being no greater than a predetermined distance. A System-on-Chip can include the integrated circuit of the present invention. In the present invention, the spare cells are placed as a function of drive strength in a pattern of unconnected combinational spare cells. The presence of the pattern in a zero utilization region of the chip can be used to detect the use of the spare cells within the region of filler cells. The distribution of spare cells has no impact upon the die size, can be implemented on any System-on-Chip, and is tool independent.

The method of distributing spare cells within a region of filler cells on an integrated circuit according to the present invention includes placing a netlist with a placement tool, leaving blank spaces in the placement which the tool will later fill with filler cells, dividing the layout into a grid, and checking each slot in the grid for availability of empty spaces. If a space is found, a spare cell is placed instead of a filler cell based on the position of spares in the neighboring grid slots. The higher the drive strength of the spare cell, the smaller the number of grid squares used, and the lesser the number of inserted spares used. The granularity of the grid can be adjusted as a function of the drive strength of the combinational cell used as the spare cell to fill the empty space and of the space available. The logic used in the spare cells is statistically determined from previous designs or can be a mix of logic.

While having described above the principles of the present invention in conjunction with a specific circuit, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. For example, the present invention and method thereof may be implemented using Synopsys, Inc.'s IC Compiler EDA tool with the TCL scripting language. Numerous other tools known to those of skill in the art may, however, also be used to implement the method of the present invention as desired. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. An integrated circuit, comprising spare cells disposed within a region of filler cells, a distance between each spare cell and any adjacent spare cell being no greater than a predetermined distance, wherein the predetermined distance comprises a function of a Manhattan distance, Euclidean or through a Steiner tree.

2. A system comprising the integrated circuit of claim 1.

3. The integrated circuit of claim 1 wherein the spare cells are placed as a function of drive strength.

4. The integrated circuit of claim 1 further comprising a pattern of unconnected combinational spare cells.

5. The integrated circuit of claim 4, wherein the presence of the pattern in a zero utilization region can be used to detect the use of the spare cells within the region of filler cells.

6. The integrated circuit of claim 1, wherein the distribution of spare cells has no impact upon die size.

7. The integrated circuit of claim 1, wherein the distribution of spare cells can be implemented on any System-on-Chip.

8. A method of distributing spare cells within a region of filler cells on an integrated circuit comprising:
   placing a netlist with a placement tool;
   leaving blank spaces in the placement which the tool will later fill with filler cells;
   dividing the layout into a grid;
   checking each cell in the grid for availability of empty spaces;
   if a space is found and the spare cell pattern permits and/or requires a spare cell placement, a spare cell is placed instead of a filler cell; and
   the higher the drive strength of the spare cell, the smaller the number of grid squares used, and the lesser the number of inserted spares used and vice versa.

9. The method of claim 8 further comprising adjusting the granularity of the grid as a function of a drive strength of the a combinational cell used as the spare cell to fill the empty space.

10. The method of claim 8 wherein the logic used in the spare cell can be statistically determined from previous designs.

11. The method of claim 8 wherein the logic used in the spare cell comprises a mix of logic.

12. The method of claim 8 wherein the spare cells are placed using a predetermined distance comprises a function of a Manhattan distance, Euclidean or through a Steiner tree.

13. The method of claim 8 wherein the integrated circuit is a part of a System-on-Chip.

14. The method of claim 8 wherein placing the spare cells further comprises placing a specific pattern of unconnected combinational spare cells.

15. The method of claim 8, wherein the presence of a pattern in a zero utilization region can be used to detect the use of the spare cells within the region of filler cells.

16. The method of claim 8, wherein the distribution of spare cells has no impact upon die size.

17. The method of claim 8, wherein the distribution of spare cells can be implemented on any System-on-Chip.

* * * * *